United States Patent
Walcher

(10) Patent No.: US 9,069,011 B2
(45) Date of Patent: Jun. 30, 2015

(54) ELECTRICAL TERMINAL TEST POINT AND METHODS OF USE

(75) Inventor: James W. Walcher, Wilmington, IL (US)

(73) Assignee: Exelon Generation Company, LLC, Kennett Square, PA (US)

( * ) Notice: Subject to any disclaimer, the term of this patent is extended or adjusted under 35 U.S.C. 154(b) by 601 days.

(21) Appl. No.: 12/557,749

(22) Filed: Sep. 11, 2009

(65) Prior Publication Data

US 2011/0062975 A1    Mar. 17, 2011

(51) Int. Cl.
*G01R 31/20* (2006.01)
*G01R 1/067* (2006.01)
*G01R 1/04* (2006.01)

(52) U.S. Cl.
CPC .......... *G01R 1/06705* (2013.01); *G01R 1/0408* (2013.01)

(58) Field of Classification Search
CPC ............................................. H01L 2225/06596
USPC ............. 324/750.26–750.29, 754.01–754.03, 324/538; 439/477, 481, 482
See application file for complete search history.

(56) References Cited

U.S. PATENT DOCUMENTS

| | | | | |
|---|---|---|---|---|
| 3,069,738 | A | * | 12/1962 | Nelson ........................ 294/82.23 |
| 3,201,746 | A | * | 8/1965 | Askew ............................ 439/729 |
| 3,911,342 | A | | 10/1975 | Herwig |
| 4,000,444 | A | | 12/1976 | Douglas et al. |
| 4,281,888 | A | * | 8/1981 | Seaman ........................... 439/692 |
| 4,390,232 | A | * | 6/1983 | Jamgotchian .................... 439/38 |
| 4,621,230 | A | * | 11/1986 | Crouch et al. ................. 324/110 |
| 4,697,720 | A | | 10/1987 | Hotchkiss et al. |
| 4,729,798 | A | * | 3/1988 | Nanigian ...................... 136/221 |
| 4,744,004 | A | | 5/1988 | Hammond |
| 5,034,749 | A | | 7/1991 | Jungblut et al. |
| 5,086,368 | A | | 2/1992 | Gerke et al. |
| 5,149,278 | A | | 9/1992 | Waas et al. |
| 5,184,099 | A | | 2/1993 | DiMarco et al. |
| 5,234,359 | A | * | 8/1993 | Takahashi et al. ............. 439/481 |
| 5,457,392 | A | * | 10/1995 | Filipescu ....................... 324/555 |
| 5,677,616 | A | | 10/1997 | Ooiwa |
| 5,716,231 | A | * | 2/1998 | Meeker et al. ................. 439/502 |
| 5,836,791 | A | | 11/1998 | Waas et al. |
| 6,032,994 | A | * | 3/2000 | Chen et al. ..................... 294/213 |
| 6,074,257 | A | | 6/2000 | Fasano |

(Continued)

OTHER PUBLICATIONS

PCT/US2010/048490, Nov. 4, 2010, International Search Report.

(Continued)

*Primary Examiner* — Huy Q Phan
*Assistant Examiner* — Giovanni Astacio-Oquendo
(74) *Attorney, Agent, or Firm* — Ballard Spahr LLP

(57) ABSTRACT

Described herein are embodiments of an electrical terminal test point that can be temporarily attached to an electrical terminal (e.g., terminal block) in order to provide an interface between the test leads/jumpers of a test device and the electrical contact points of the electrical terminal. In one aspect, embodiments of the electrical terminal test point provide a shield for the electrical contact points of the electrical terminal (whether or not being used for testing) from inadvertent contact and prevents test leads/jumpers of test device from accidentally falling off or being knocked off of their contact points. Electrical terminal test point can be installed and removed without affecting the electrical connections made by electrical terminal (e.g., without removing terminal screws of electrical terminal).

24 Claims, 14 Drawing Sheets

(56) References Cited

U.S. PATENT DOCUMENTS

| | | | |
|---|---|---|---|
| 6,150,830 A | 11/2000 | Schmid et al. | |
| 6,462,529 B1* | 10/2002 | Campbell | 324/72.5 |
| 6,653,825 B2* | 11/2003 | Munniksma | 324/72.5 |
| 6,731,117 B1* | 5/2004 | Slough | 324/538 |
| 6,736,683 B2 | 5/2004 | Brand et al. | |
| 6,791,351 B2* | 9/2004 | Fischer et al. | 324/765.01 |
| 7,057,401 B2* | 6/2006 | Blades | 324/713 |
| 7,153,157 B2 | 12/2006 | Robinson et al. | |
| 7,526,972 B2* | 5/2009 | Stevens | 73/866.5 |
| 8,134,377 B1* | 3/2012 | Campbell et al. | 324/750.22 |
| 8,536,839 B2* | 9/2013 | Hobelsberger et al. | 322/99 |
| 8,552,757 B2* | 10/2013 | Simon | 324/765.01 |
| 8,558,554 B2* | 10/2013 | Erdman et al. | 324/537 |
| 2003/0076203 A1 | 4/2003 | Brooks | |
| 2003/0117144 A1* | 6/2003 | Sutton | 324/546 |
| 2004/0201388 A1* | 10/2004 | Barr | 324/754 |
| 2005/0035767 A1* | 2/2005 | Hardy | 324/538 |
| 2005/0112941 A1 | 5/2005 | Droesbeke et al. | |
| 2006/0021784 A1 | 2/2006 | Garmong | |
| 2006/0160413 A1 | 7/2006 | Robinson et al. | |
| 2006/0181265 A1 | 8/2006 | Saito | |
| 2007/0184726 A1* | 8/2007 | Shuey | 439/726 |
| 2007/0236236 A1* | 10/2007 | Shell et al. | 324/763 |
| 2008/0309347 A1* | 12/2008 | Kurtz | 324/522 |
| 2010/0201387 A1* | 8/2010 | Jakeman | 324/754 |
| 2010/0237875 A1* | 9/2010 | Limcolioc | 324/504 |

OTHER PUBLICATIONS

PCT/US2010/048490, Nov. 4, 2010, Written Opinion.

* cited by examiner

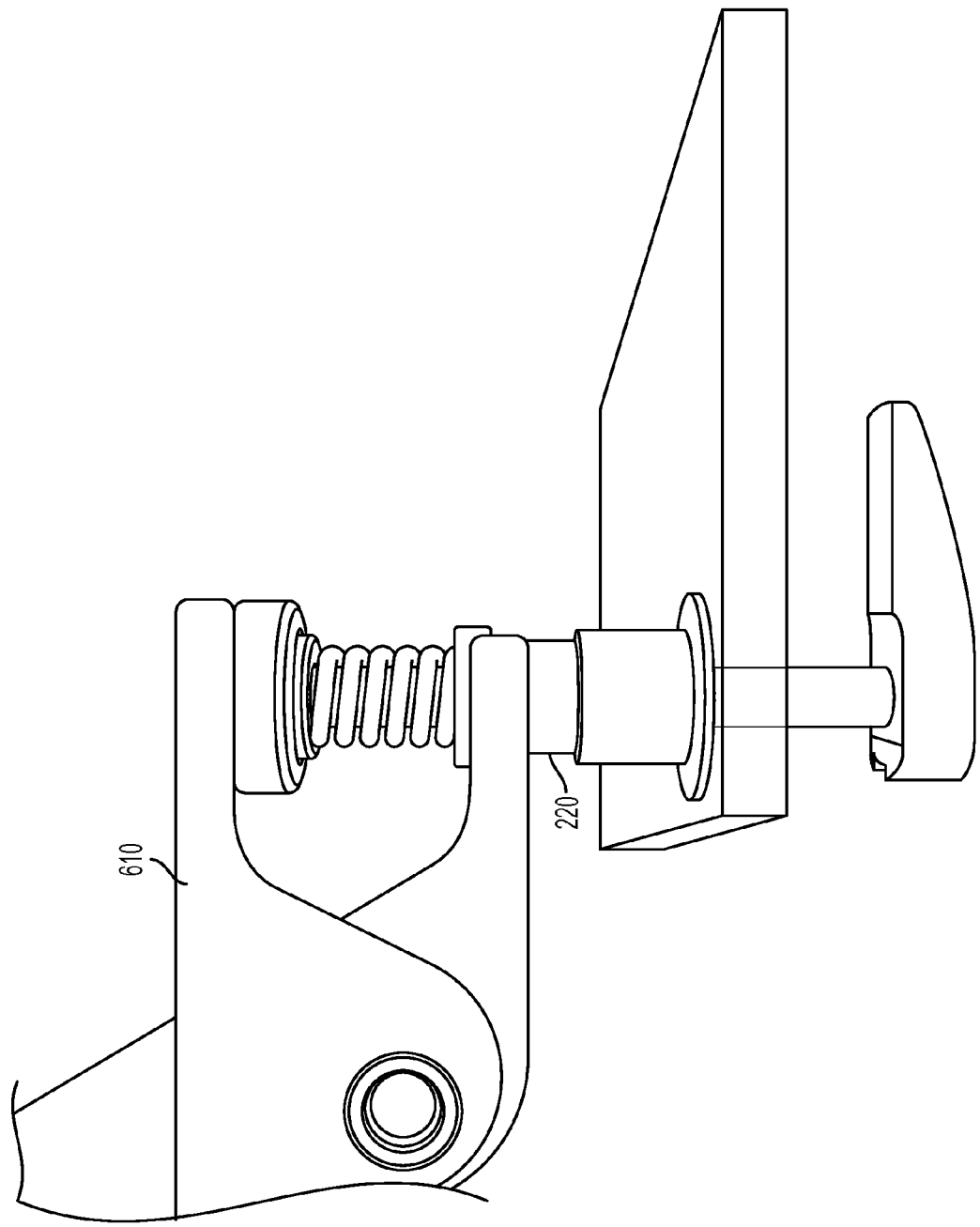

ELECTRICAL TERMINAL TEST POINT AND METHODS OF USE

BACKGROUND

In many instances there is a need to take voltage readings or to test other electrical characteristics of an electrical system at or between various electrical contact points on an electrical terminal. Test devices, such as multi-meters, recording voltmeters, etc. are used on the electrical systems to take readings or record information about electrical parameters and characteristics (e.g., voltage, current, resistance, real power, reactive power, etc.) of the system. Generally, test devices are electrically connected to contact points in the electrical system via test leads. Contact points are generally associated with electrical terminals such as a terminal block. Test leads generally have connectors on at least one end for attaching to the contact point and the test device. These connectors can comprise, for instance, alligator clips, banana jack plugs, current stabs, mini-grabbers, pin jacks, etc. A drawback, however, to using such connectors is that generally there is no way to securely attach the connector to the contact point without disrupting electrical continuity through the contact point. For example, banana jack connectors can be installed permanently to a contact point, but it requires opening the contact point, thus disrupting continuity, for installation of the banana jack connector. Further, in some critical systems, extensive review and analysis must be conducted before a test device is connected to a contact point to avoid accidental tripping of protective systems, outages, voltage variations, grounding, adding resistance to a circuit, etc. Connectors may also come loose after attachment to a contact point, thus disrupting the testing or possibly causing a short or fault in the system. This is especially prevalent in high vibration areas such as power plants.

A need, therefore, exists for a device and methods of using embodiments of the device to overcome challenges in the art, some of which are described above.

SUMMARY

Described herein are embodiments of an electrical terminal test point that can be temporarily attached to an electrical terminal (e.g., terminal block) in order to provide an interface between the test leads/jumpers of a test device and the electrical contact points of the electrical terminal. In one aspect, embodiments of the electrical terminal test point provide a shield for the electrical contact points of the electrical terminal (whether or not being used for testing) from inadvertent contact and prevents test leads/jumpers of test device from accidentally falling off or being knocked off of their contact points. Electrical terminal test point can be installed and removed without affecting the electrical connections made by electrical terminal (e.g., without removing terminal screws of electrical terminal). Further, embodiments as described herein can be specifically configured for certain electrical test, therefore reducing or eliminating review and analysis time.

Methods of using described embodiments are also provided, including selecting a particular test and selecting and attaching an electrical terminal test point configured for the selected test to a designated electrical terminal.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIGS. 6C-6I illustrate various attachment mechanisms that can be used in embodiments of an electrical terminal test point;

DETAILED DESCRIPTION

Figure 1:
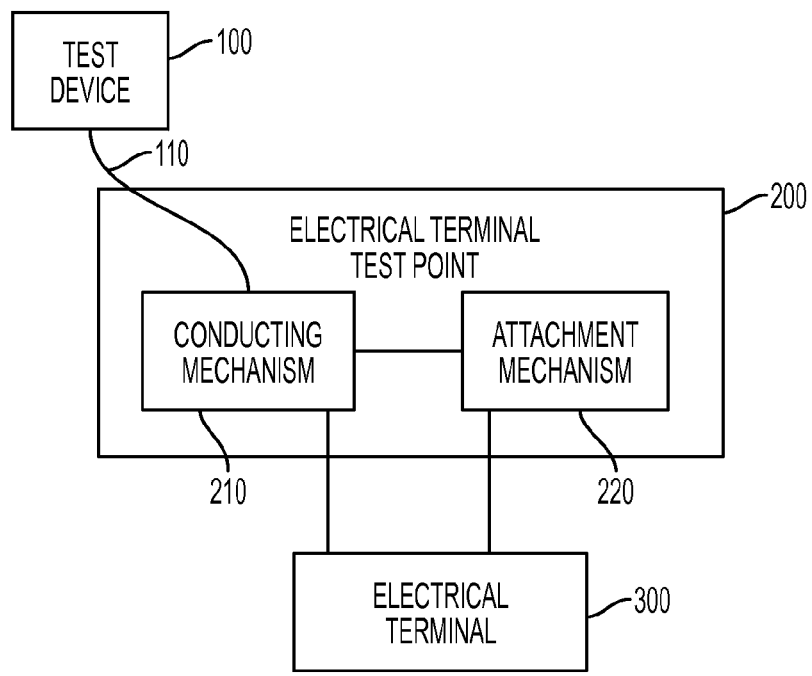
FIG. 1 is an exemplary block system diagram illustrating an overview of an implementation of embodiments of an electrical terminal test point.

Before the present methods and systems are disclosed and described, it is to be understood that the methods and systems are not limited to specific synthetic methods, specific components, or to particular compositions, as such may, of course, vary. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Overview:

Test devices, such as multi-meters, recording voltmeters, etc. are used on electrical systems to take readings or record information about electrical parameters and characteristics (e.g., voltage, current, resistance, real power, reactive power, etc.) of the system. Generally, test devices are electrically connected to contact points in the electrical system via test leads or jumpers. Contact points are generally associated with electrical terminals such as a terminal block. Test leads generally have connectors on at least one end for attaching to the contact point and the test device. These connectors can comprise, for instance, alligator clips, banana jack plugs, current stabs, mini-grabbers, pin jacks, etc. A drawback, however, to using such connectors is that generally there is no way to securely attach the connector to the contact point without disrupting continuity through the contact point. For example, banana jack connectors can be installed permanently to a contact point, but it requires opening the contact point, thus disrupting continuity, for installation of the banana jack connector. Further, in some critical systems, extensive review and analysis must be conducted before a test device is connected to a contact point to avoid accidental tripping of protective systems, outages, voltage variations, grounding, adding resistance to a circuit, etc. Connectors may also come loose after attachment to a contact point, thus disrupting the testing or possibly causing a short or fault in the system. This is especially prevalent in high vibration areas such as power plants.

In FIG. 1, a test device 100 is connected via test leads or jumpers 110 to a conducting mechanism 210 of an electrical terminal test point 200. The test device 100 can be an instrument such as for example a multi-meter that can be used to test or record voltage or other electrical parameters or characteristics (e.g., resistance, current) at or across electrical contact points of an electrical terminal 300. The test leads 110 can be a part of, or connected to the test device 100. The test leads 110 provide an electrical connection between the test device 100 and electrical contact points (not shown in FIG. 1) of an electrical terminal 300 through the conducting mechanism 210 of the electrical terminal test point 200. The conducting mechanism 210 can provide a secure connection to the test lead 110 without having to disrupt the contact point. For example, the test lead 110 may have a banana jack plug on one end, which can securely mate with a banana jack connector that is incorporated into the conducting mechanism 210. Other connectors such as pin jacks and connectors, screw connectors, ring-tongue connectors, etc. can also be used to connect the test leads 110 to the conducting mechanism 210.

As shown in FIG. 1, an embodiment of the electrical terminal test point 200 provides an interface between test leads 110 of a test device 100 and the electrical contact points of an electrical terminal 300.

Figure 2:
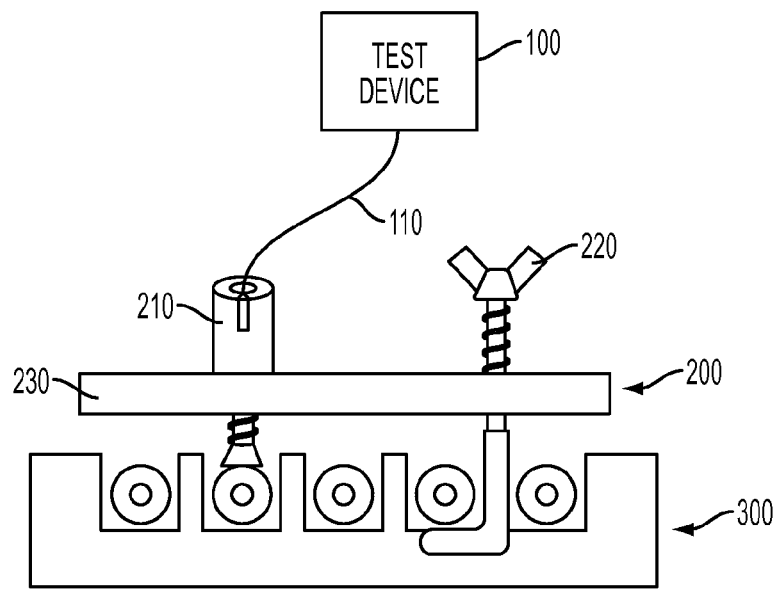
FIG. 2 is an elevation view one embodiment of an electrical terminal test point providing an interface between a contact point of an electrical terminal and a test device.

FIG. 2 is an elevation view one embodiment of an electrical terminal test point 200 providing an interface between a contact point 330 of an electrical terminal 300 and a test device 100. As shown in FIG. 2, the test device 100 is connected to the conducting mechanism 210 of the electrical terminal test point 200 via leads 110. In the embodiment shown in FIG. 2, the electrical terminal test point 200 is held in place substantially in contact with the electrical terminal 300 by an attachment mechanism 220. In this embodiment, the attachment mechanism 220 comprises a rotatable spring-loaded L-shaped hook that can be attached to leads or wires that are terminated on the electrical terminal 300. Further comprising the embodiment of an electrical terminal test point as shown in FIG. 2 is a shield 230, which can protect the contact points of the electrical terminal 300 from accidental contact and provide a means for operably connecting the conducting mechanism 210 and the attachment mechanism 220 such that electrical contact can be made between the conducting mechanism 210 and a contact point of the electrical terminal 300.

Figure 3:
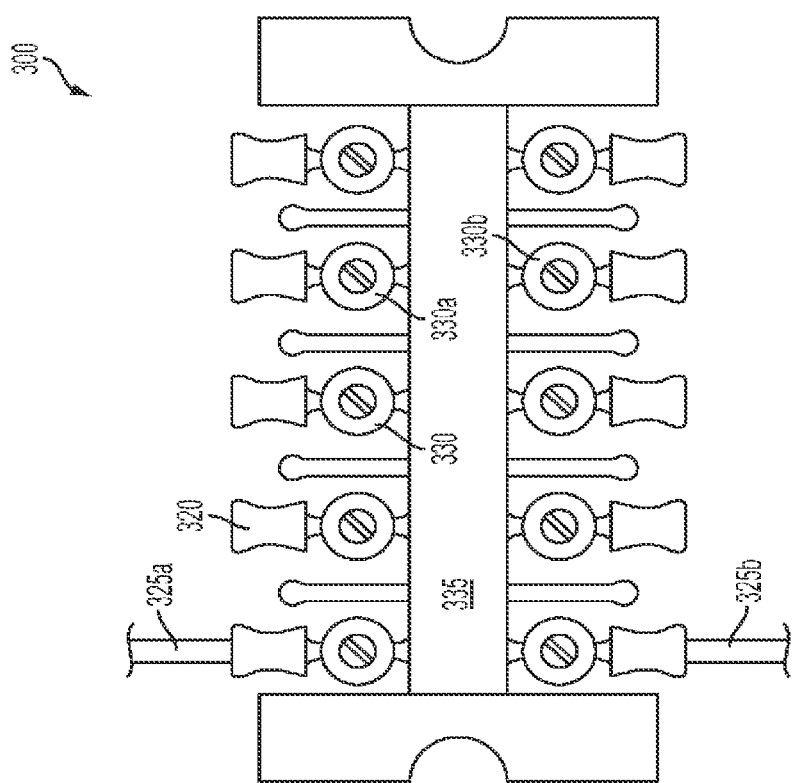
FIG. 3 is a plan view of an exemplary electrical terminal.

FIG. 3 is a plan view of an exemplary electrical terminal 300. An electrical terminal 300 is a device in an electrical system that provides means for electrically interconnecting two or more terminal elements (e.g. wires) 325a, 325b via an electrically conductive connecting bar 335 (i.e., current bar). Electrical terminals 300 provide a connection point for connecting equipment, components and devices to an electrical system, a splice point for wiring, and test or measurement points for testing and monitoring electrical systems. Generally, an electrical terminal 300 is comprised of a terminal block such as those available from, for example, Marathon Special Products of Bowling Green, Ohio, among others. Generally, a terminal block is comprised of a housing with one or more wire insertion openings 320 for inserting wires/leads 325a, 325b. Wires/leads 325a, 325b are landed on electrical contact points 330, where the wire/lead 325a, 325b is pulled against the current bar. The wire/lead can be pulled against the current bar by, for example, terminal screws, tension springs, or other means as are known in the art. The electrically conductive connecting bar (or current bar) provides electrical continuity between contact points 330. Generally, electrical continuity is provided from a first contact point 330a on one side of the terminal block to a second contact point 330b directly opposite the first contact point by the current bar, though in some instances continuity is provided to adjacent contact points via jumpers or additional current bars. Though FIG. 3 illustrates an electrical terminal 300 having ten electrical contact points 330, it is to be appreciated that embodiments of the invention can be configured to interface with electrical terminals having more or fewer contact points 330 than shown in FIG. 3.

Figure 4:
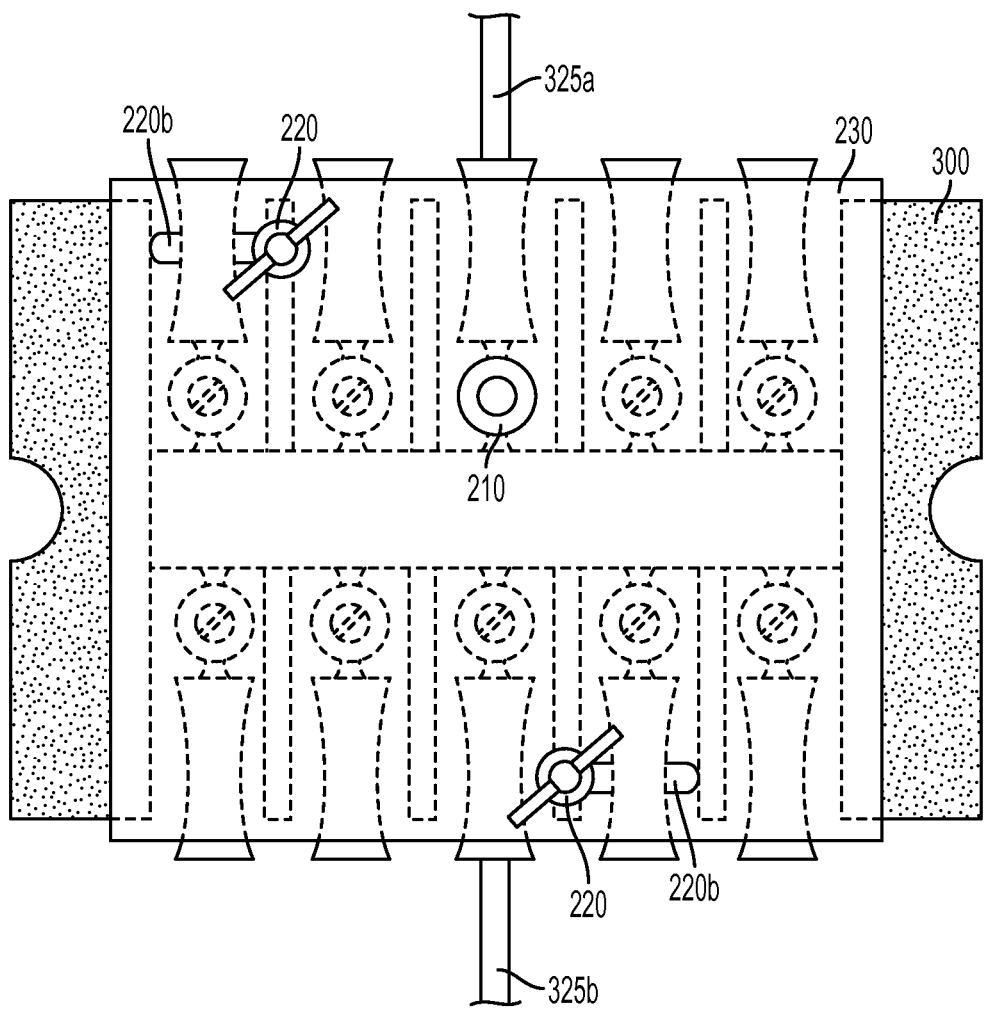
FIG. 4 is a plan view of an embodiment of an electrical terminal test point in place and attached to an exemplary electrical terminal.

FIG. 4 is a plan view of an embodiment of an electrical terminal test point 200 in place and attached to an exemplary electrical terminal 300. As shown in FIG. 4, the lower hook-shaped portion 220b of each of one or more attachment mechanisms 220 has been rotated to engage with one or more wire insertion openings 320 for inserting wires/leads 325a, 325b or the actual wires/leads 325a, 325b. In one aspect, at least a portion of the attachment mechanism 220 can be insulated. For instance, the lower hook-shaped portion 220b of each of one or more attachment mechanisms 220 can be comprised of insulating material, such as plastic, or be comprised of conductive materials (e.g., metal), but with an insulating coating. In other aspects, the entire attachment mechanism 220 is comprised of insulated materials or insulated-coated materials. In this embodiment, the upper portion of at least one of the one or more attachment mechanisms 220 is spring-loaded, thus exerting tension on the one or more wire insertion openings 320 for inserting wires/leads 325a, 325b or the actual wires/leads 325a, 325b and holding the electrical terminal test point 200 in place substantially in contact with the electrical terminal 300. The tension supplied by the one or more attachment mechanisms further supplies pressure to hold the conducting mechanism 210 of the electrical terminal test point 200 in substantial electrical contact with a contact point 330 of the electrical terminal 300, providing electrical continuity from a test lead connected to the conducting mechanism 210 to the contact point 330. Further comprising the embodiment of an electrical terminal test point 200 as shown in FIG. 4 is a shield 230, which operably connects the one or more attachment mechanisms 220 and the one or more conducting mechanisms 210 and can further protects the contact points 330 from accidental contact. Though the shield 230 can be comprised of various materials, including conductive materials, it is generally comprised of non-conductive materials. It one aspect, the shield is comprised of translucent material or has cut-outs or mesh windows so that wiring, electrical terminals and contact points underneath can be at least partially visible through the shield. In one aspect, the shield can include a handle, which facilitates placement and attachment of the electrical terminal test point 200 as well as portability.

Figure 5A:
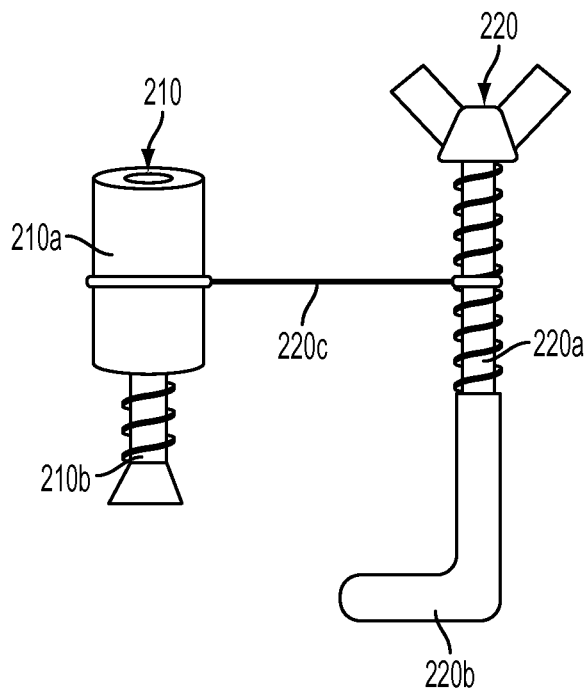
FIG. 5A is an elevation view of an embodiment of an electrical terminal test point.
Figure 5B:
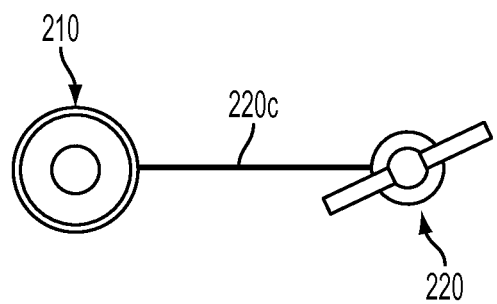
FIG. 5B is a plan view of the embodiment of an electrical terminal test point shown in FIG. 5A.

FIG. 5A is an elevation view of an embodiment of an electrical terminal test point 200 and FIG. 5B is a plan view of the embodiment shown in FIG. 5A. As shown in FIGS. 5A and 5B, this embodiment is comprised of at least one attachment mechanism 220 and at least one conducting mechanism 210. The conducting mechanism 210 provides an electrical connection between test leads/jumpers of a test device and electrical contact points of an electrical terminal. As shown in the embodiment of FIG. 5A, the conducting mechanism can be generally comprised of two parts, a first part 210a and a second part 210b. The first part 210a is generally comprised of an insulated portion that substantially surrounds a conductive element. The first part 210a provides an externally insulated electrical contact point to which the test leads/jumpers of the test device can be connected. The conductive element of the first part 210a is generally configured to adapt to a connector associated with a test lead/jumper. For example, the conductive element can be adapted to accept a banana jack, though other connector types can be used. The second part 210b of the conducting mechanism 210 is comprised of a conductive portion. The conductive portion can be a part of or electrically connected to the conductive element of the first part 210a. The second part 210b contacts and provides pressure to an electrical contact point of an electrical terminal (e.g., a terminal screw of a terminal block) without being physically or mechanically attached to the contact point. For instance, the second part 210b doesn't go underneath electrical terminal contact point (like a permanently installed banana connector or ring-lug, for example) and, therefore, can be added/removed without disturbing electrical terminal connections. Likewise, the second part 210b doesn't clip onto electrical terminal contact point (like an alligator clip, for example) and, therefore, does not easily fall off. Generally, the conductive portion is externally or internally spring-loaded to provide the pressure, though other means of applying pressure are contemplated such as screws, pneumatic, hydraulic, deformation of a malleable solid, etc.

Though not shown in FIG. 5A or 5B, in one embodiment of an electrical terminal test point where a shield is included, the conducting mechanism 210 protrudes through the shield, wherein the shield can delineate the first 210a and second portions 210b of the conducting mechanism 210. It is to be appreciated that an electrical terminal test point can be comprised of one or more conducting mechanisms, which can be strategically placed based on a specific test being conducted on an electrical terminal using a particular electrical terminal test point. The number of conducting mechanisms associated with an electrical terminal test point can include any number of conducting mechanisms up to the number of contact points (e.g., terminal screws) of the electrical terminal that the electrical terminal test point is configured to be attached to. It is also to be appreciated that conducting mechanisms not being used for a particular test can be identified, capped, sealed or blocked to avoid inadvertent connection with a contact point on an electrical terminal not involved in the particular test. Conversely, conducting mechanisms that will be used in a particular test can likewise be identified.

Further comprising the electrical terminal test point of FIGS. 5A and 5B is an attachment mechanism 220. The attachment mechanism 220 maintains the one or more conducting mechanisms 210 in contact with a contact point of an electrical terminal. Though not shown in FIGS. 5A and 5B, in an embodiment of an electrical terminal test point further comprising a shield, the attachment mechanism further maintains the shield in contact with at least a portion of the electrical terminal. The attachment mechanism 220 is separate from the conducting mechanism 210, which is unlike a banana jack or alligator clip, where jack/clip itself provides both the clipping and the conducting mechanism. As shown in the embodiment of FIG. 5A, the attachment mechanism 200 can comprise a first portion 220a, a second portion 220b, and a third portion 220c. The first portion 220a is a spring-loaded section of the attachment mechanism that works cooperatively with the second portion 220b to apply pressure to the conducting mechanism through the third portion 220c in order to hold the conducting mechanism in contact with a contact point of an electrical terminal. In one aspect, the second portion 220b comprises an L-shaped hook that can attach to an electrical terminal through a lead or wire associated with the electrical terminal or by attaching directly to the electrical terminal. The attachment mechanism of FIG. 5A can be rotated to attach the second portion 220b to the electrical terminal. In one aspect, the attachment mechanism 220 can comprise wings, have a knurled texture or provide other means for facilitating rotation by hand. The spring-loaded configuration of the attachment mechanism 220 allows it to be depressed to further effectuate attachment to the electrical terminal and to hold tension against the electrical terminal once in place. In various aspects, the attachment mechanism can be comprised of one or more of uninsulated conductive materials, partially insulated conductive materials, or non-conductive materials. For example, in one instance the L-shaped portion 220b may be insulated. In other aspects, the second portion 220b of the attachment mechanism 220 can be hook or J-shaped (reference FIG. 6B), or in any other configuration that provides for attachment of the electrical terminal test point to an electrical terminal. In other embodiments, the attachment mechanism can be various fasteners such as one or more screws that screw into the electrical terminal or material surrounding the electrical terminal or a fastener such as Cleco temporary sheet metal fastener available from Cleco Industrial Fasteners, Inc. of Harvey, Ill., among others. FIG. 5B is a plan view of the embodiment of FIG. 5A illustrating the conducting mechanism 210, the attachment mechanism 220, and the third portion 220c of the attachment mechanism 220 that connects the conducting mechanism 210 and the attachment mechanism 220.

Embodiments of the electrical terminal test point provide a secure way to test electrical systems that can be installed and removed without disturbing electrical terminal connections. Embodiments of the electrical terminal test point can be adapted and scaled to any size electrical terminal from any manufacturer. Embodiments of the electrical terminal test point can also be configured for various working voltages and currents. For example, an electrical terminal test point may have a working voltage of 600 volts, be electrically tested at 2500 volts, and be made of material rated at 5000 volts. Use of an electrical terminal test point adapted to a specific electrical terminal can speed up terminal point verification and will not fall off.

Figure 6A:
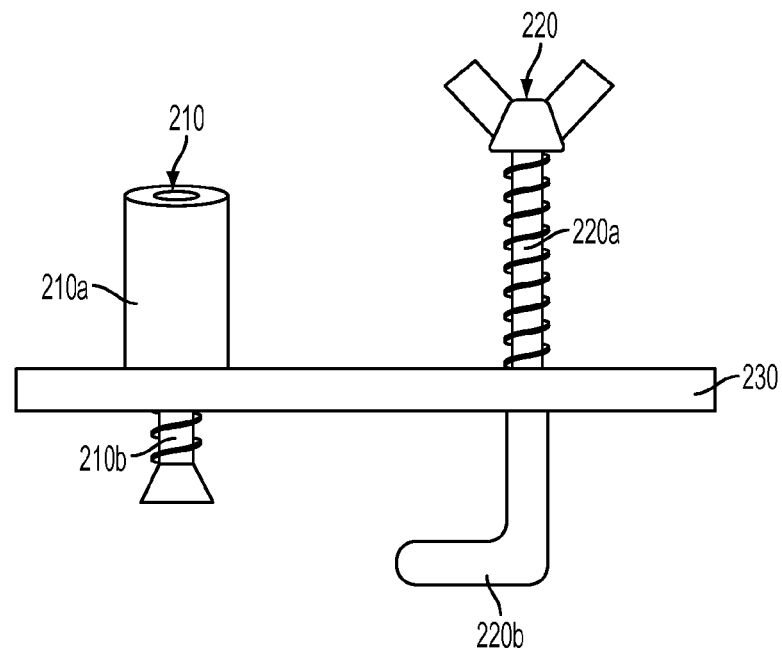
FIGS. 6A and 6B provide elevation views of additional embodiments of an electrical terminal test point.
Figure 6B:
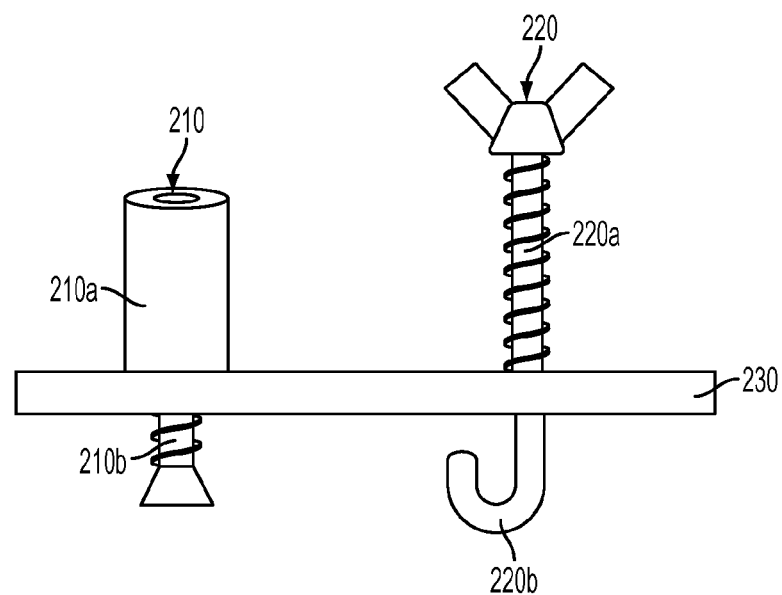
Figure 6C:
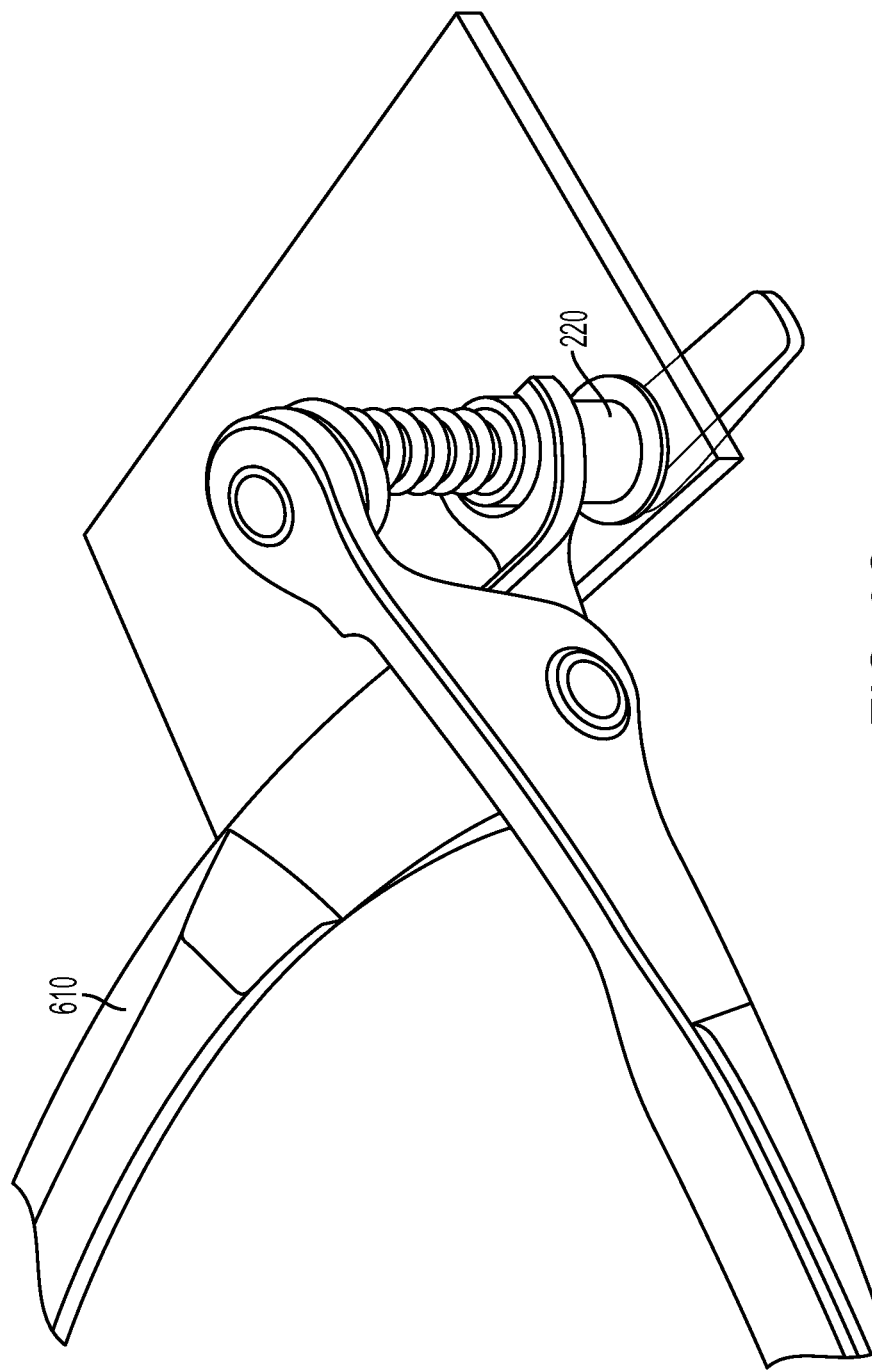
Figure 6D:
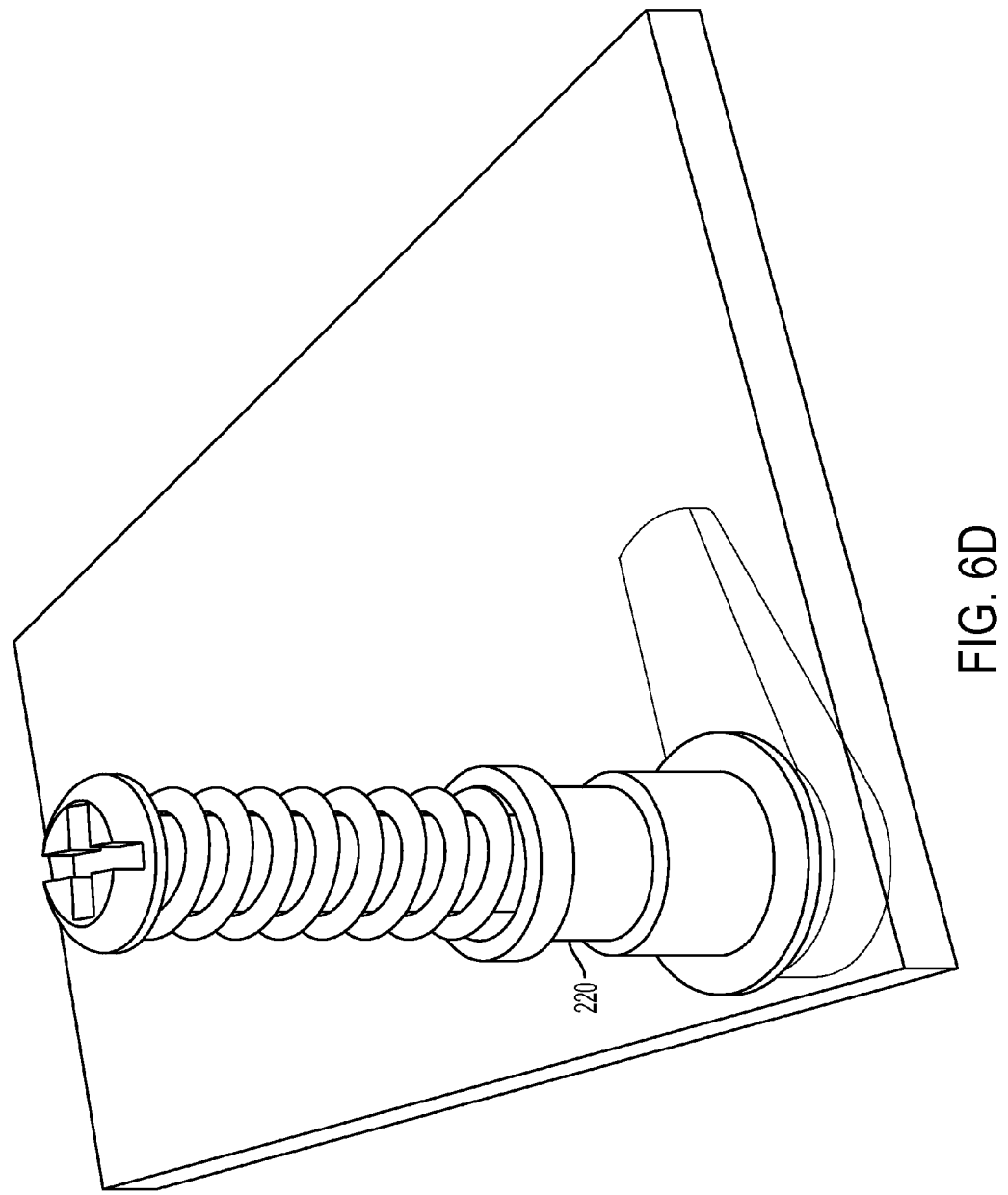
Figure 6F:
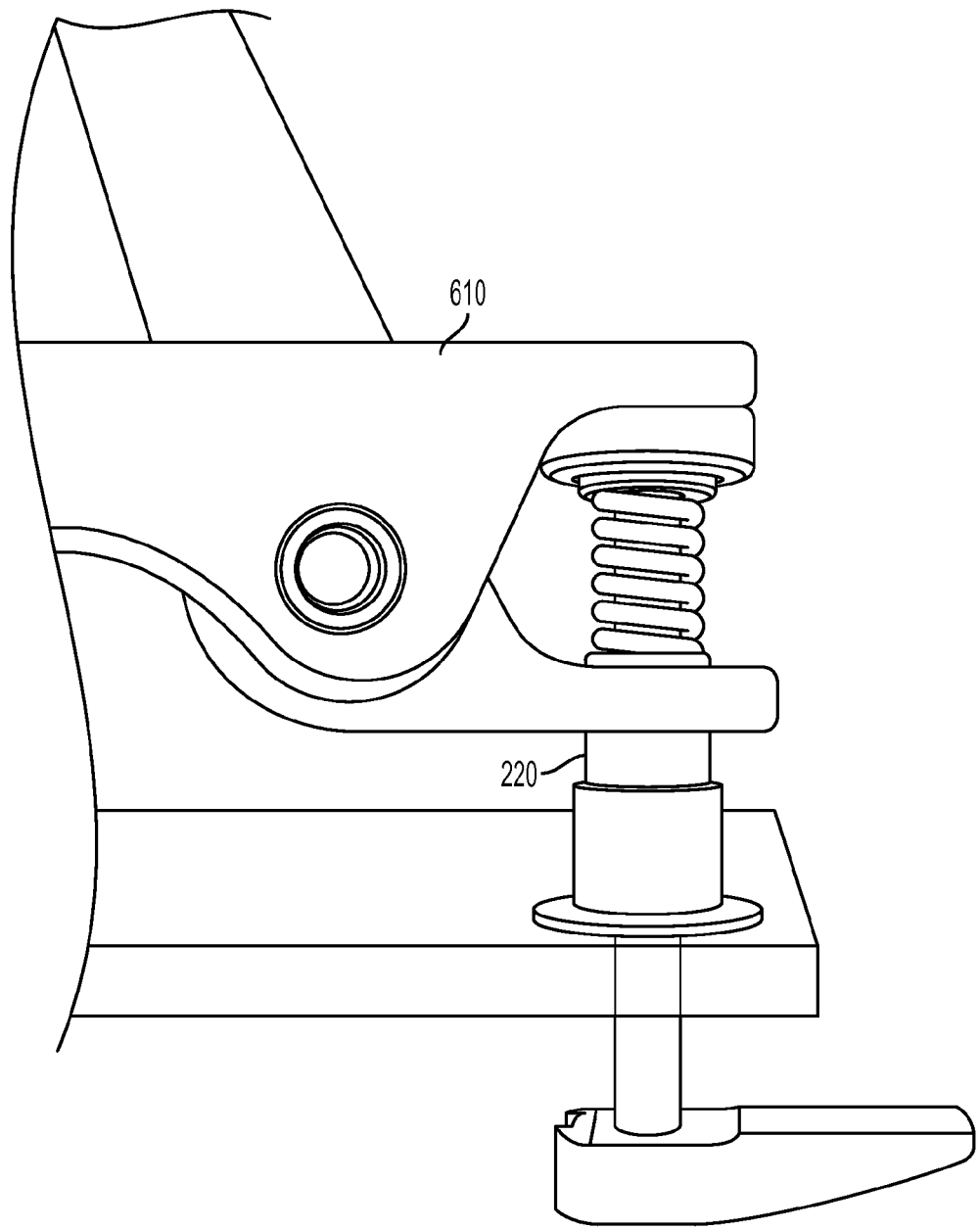

FIGS. 6A and 6B provide elevation views of additional embodiments of an electrical terminal test point. FIG. 6A illustrates an electrical terminal test point comprised of a conducting mechanism having a first part 210a and a second part 210b, an attachment mechanism 220 having a first part 220a and a second part 220b, and a shield 230 that operably interconnects the conducting mechanism 210 and the attachment mechanism 220. In the embodiment shown in FIG. 6A, the second portion 200b of the attachment mechanism 220 is comprised of an L-shaped hook. The first portion 220a is spring loaded so as to hold the shield substantially against an electrical terminal. Though shown with only one conducting mechanism 210 and one attachment mechanism, it is to be appreciated that the electrical terminal test point can be comprised of one or a plurality of attachment mechanisms 220 and one or a plurality of conducting mechanisms 210. In the embodiment shown in FIG. 6B, the second portion 220b of the attachment mechanism 220 is a J-shaped hook.

As shown in the embodiments of FIGS. 6A and 6B, the electrical terminal test point can comprise a shield 230. In addition to providing a means for interconnecting the one or more conducting mechanisms 210 and the one or more attachment mechanisms 220, the shield 230 further protects electrical contact points of the electrical terminal (whether being used for testing or not) from inadvertent contact. Generally, the shield 230 is non-metal (e.g., nylon, etc.), though it is contemplated that all or a portion of the shield can be metal. In one aspect, the shield 230 can be at least partially comprised of a substantially translucent material such as, for example, poly-carbonate, such as lexan. As noted above, a shield is not required to practice the invention.

FIGS. 6C-6I illustrate various attachment mechanisms that can be used in embodiments of an electrical terminal test point. For example, FIGS. 6C-6F illustrate a spring loaded attachment mechanism 220. In one aspect, the spring-loaded attachment mechanism 220 is operated by a tool 610 such as the hand-held pliers shown. An advantage of requiring a tool 610 to operate the attachment mechanism is that a person could not inadvertently remove the electrical terminal test point unless they acquired the tool 610 for decompressing the retaining spring. However, embodiments of the attachment mechanism 220 are contemplated that do not require a tool 610 to operate. This attachment mechanism 220 can be used on terminal blocks that do not have mounting holes for Cleco fasteners, as previously described herein. To operate the attachment mechanism 220 shown in FIGS. 6C-6F, the tool 610 is attached to the spring, the tool 610 compresses the spring, thus extending the attachment mechanism 220 downward, the extended latch is rotated under a lug or wire attached to an electrical terminal, and the tool 610 is released, thus the spring tension forces the electrical terminal test point against the electrical terminal. The process is reversed to release the electrical terminal test point from the electrical terminal. In various aspects, all or part of the attachment mechanism 220 can be comprised of non-conductive materials such as, for example, nylon.

Figure 6G:
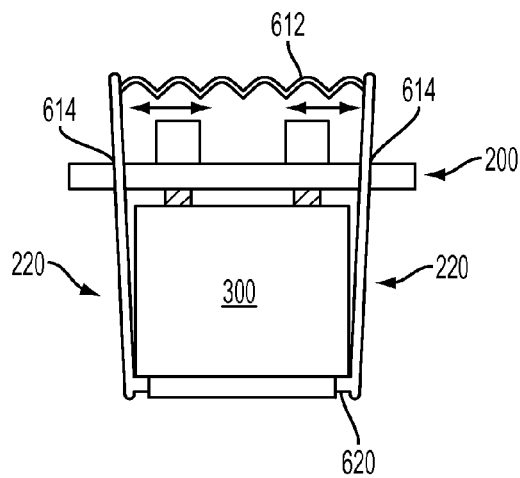
Figure 6H:
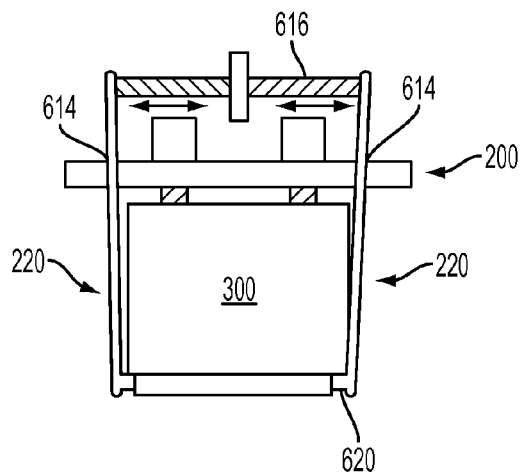
Figure 6I:
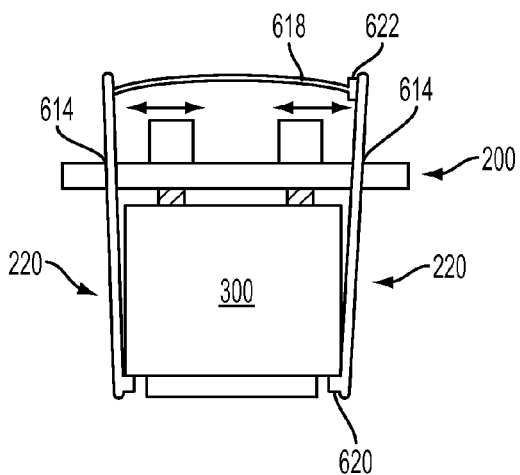

FIGS. 6G-6I illustrate various other types of attachment mechanisms 200 that can be used in various embodiments of an electrical terminal test point. For example, FIG. 6G shows a spring 612 that is used to apply pressure to two or more attachment mechanisms 220 that pivot about a pivot point 614 of an electrical terminal test point 200 and connect with a terminal block 300 via a latching mechanism 620 that can attach to or underneath the terminal block 300. In this embodiment, the electrical terminal test point terminal 200 is held in place by a the latch 620 that catches at the bottom of the terminal block 300. To operate this embodiment of an attachment mechanism 220, the top latch arms can be squeezed toward one another thereby compressing the spring 612, which allows the latch arms to spread. The electrical terminal test point 200 can be slid over the terminal block 300 and the compressed arms released. The spring 612 pushes the latches 620 onto the terminal block base. To remove, the process is reversed.

FIG. 6H illustrates an embodiment similar to that shown in FIG. 6G except the latch arms are compressed or released by use of a thumb wheel and threaded screws (collectively, 616). This embodiment uses a thumb wheel attached to a left handed screw on one side which is attached to a latch arm and on the other side is a ride handed screw attached to a latch arm. To use, the thumb wheel is rotated, which causes the latch arms to spread and the electrical terminal test point 200 can be positioned over the terminal block 300. The thumb wheel can be rotated in the opposite direction, which causes the latch arms to move in and lock on to the terminal block 300. To remove, the process is reversed.

FIG. 6I is similar to FIGS. 6G and 6H, except the retainer 618 is a strip of bendable plastic or metal. To use, position the electrical terminal test point 200 over a terminal block 300; slightly bend spring material 618 and slide into notch 622 on opposite side. The tension on the spring material 618 keep the latch locked into position onto the terminal block 300. To remove, reverse the process.

Figure 7A:
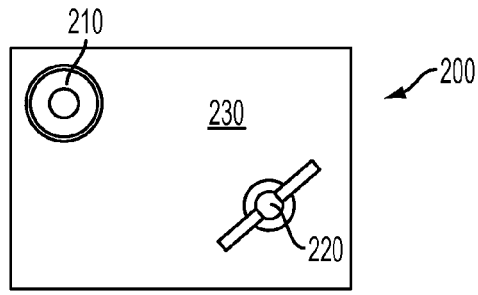
FIGS. 7A, 7B and 7C illustrate plan view of examples of various embodiments of an electrical terminal test point.
Figure 7B:
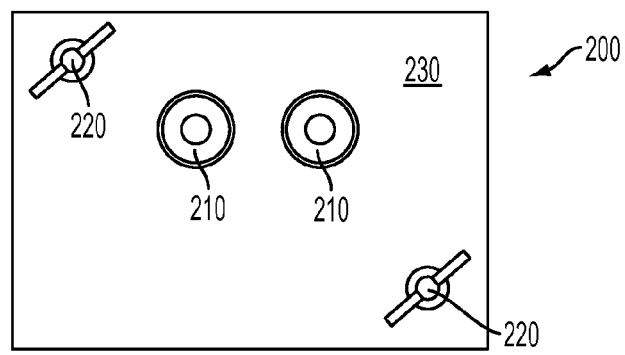
Figure 7C:
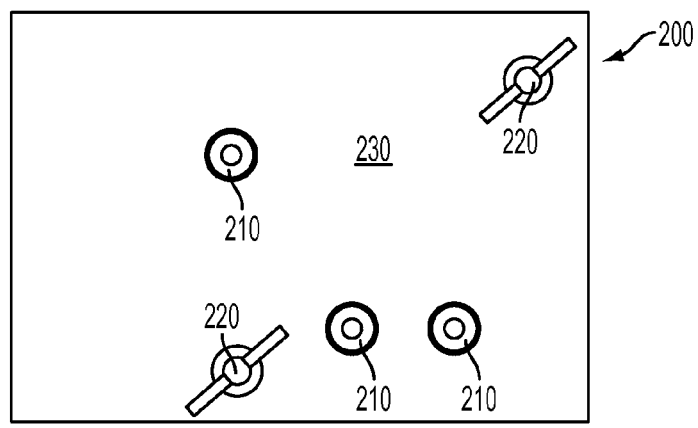

FIGS. 7A, 7B and 7C illustrate plane view of examples of various embodiments of an electrical terminal test point 200. FIG. 7A illustrates an embodiment comprised of one conducting mechanism 210, one attachment mechanism 220, and a shield 230. FIG. 7B illustrates an embodiment comprised of two conducting mechanisms 210, two attachment mechanisms 220, and a shield 230. Conducting mechanisms 210 are generally configured to align with contact points of an electrical terminal. FIG. 7C illustrates an embodiment of an electrical terminal test point 200 comprised of three conducting mechanisms 210, two attachment mechanisms, and a shield 230. As can appreciated by the examples shown in FIGS. 7A, 7B and 7C, embodiments of an electrical terminal test point can be configured with various numbers of conducting mechanisms and attachment mechanisms for interfacing with a variety of electrical terminals and for conducting particular tests on specific electrical terminals.

Figure 8A:
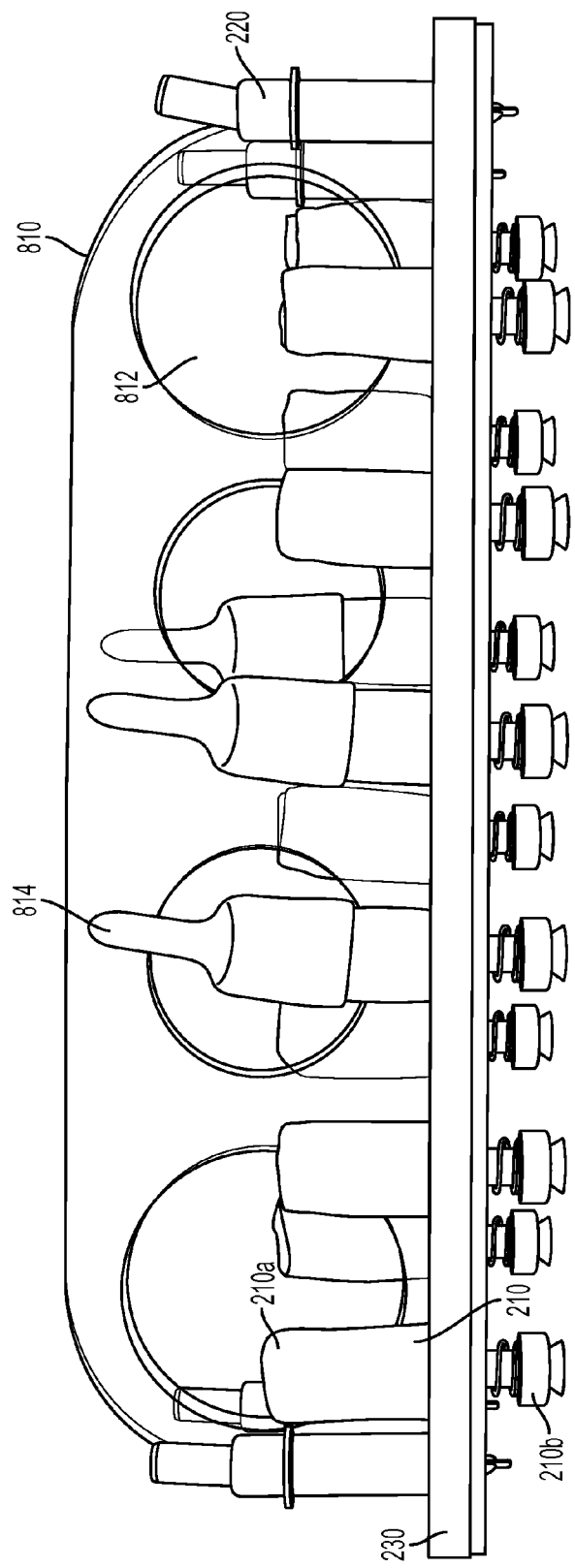
FIGS. 8A and 8B illustrate elevation and plan views, respectively, of another embodiment of an electrical terminal test point.
Figure 8B:
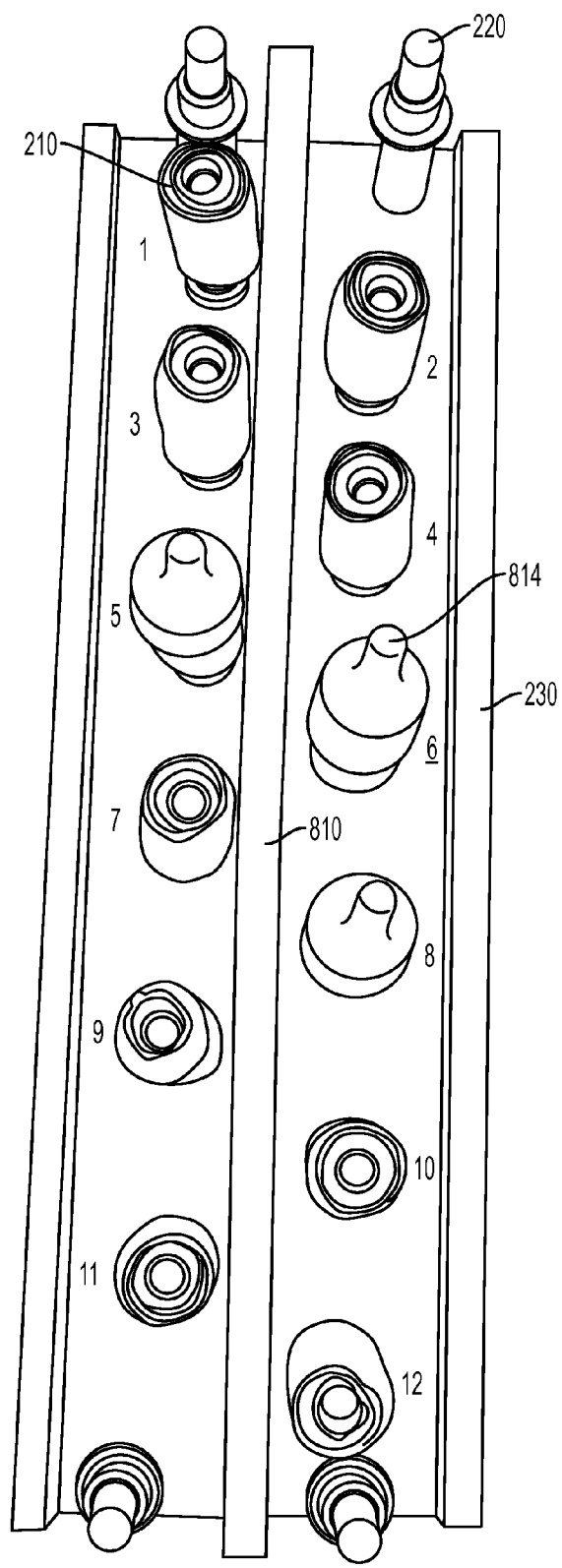

FIGS. 8A and 8B illustrate elevation and plan views, respectively, of another embodiment of an electrical terminal test point. As shown in the illustrated embodiment, the electrical terminal test point 200 is comprised of a plurality of conducting mechanisms 210 (in this instance, 12) and a plurality of attachment mechanisms 220 (four, in this instance). In this instance the attachment mechanisms 220 are Cleco fasteners, as described herein. The shield 230 of FIGS. 8A and 8B is comprised of a clear poly-carbonate. Further comprising the embodiment of FIGS. 8A and 8B is a handle 810, also comprised of poly-carbonate. The handle 810, in this embodiment, has cut-outs 812 to facilitate holding, carrying and attaching the electrical terminal test point as well as to facilitate running test leads to the conducting mechanisms 210 and attaching test leads to the test point (such as by wire ties, etc.). As noted in FIGS. 8A and 8B, several of the conducting mechanisms 210 are capped 814 so that they cannot be connected to a test lead. This allows the electrical terminal test point to be configured for a particular test and/or a particular electrical terminal.

Figure 9:
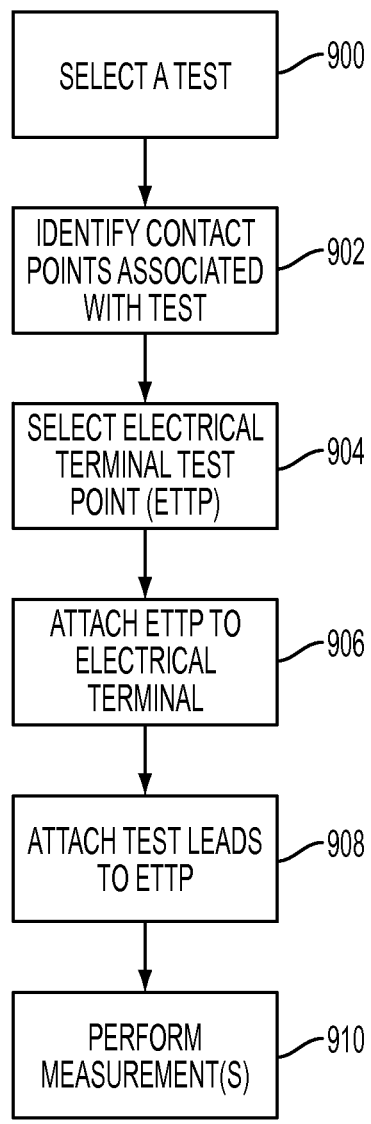
FIG. 9 is a flowcharting illustrating an embodiment of a method to test voltage or other electrical characteristics at or between electrical contact points of electrical terminal by selecting electrical terminal test point appropriate for electrical terminal and test being performed.

Method:

FIG. 9 is a flowchart illustrating an embodiment of a method to test voltage or other electrical characteristics at or between electrical contact points of an electrical terminal by selecting electrical terminal test point appropriate for the electrical terminal and test being performed. The process starts at Step 900, where a particular test is selected. For example, the test may comprise testing voltage of a circuit at a defined electrical terminal. At step 902, contact points of an electrical terminal that are associated with the selected test are identified. At step 904, an electrical terminal test point is selected. This can involve selecting an electrical terminal test point ("ETTP") appropriate for electrical terminal and test being performed. In one aspect, this may involve selecting size of electrical terminal test point. It may also involve selecting electrical terminal test point having conducting mechanisms strategically placed at a location corresponding to the electrical contact points of interest for the particular test. Selecting the ETTP may include consideration of both number and position of conducting mechanisms. At step 906, the selected ETTP is attached to the electrical terminal. Generally, this involves attaching the ETTP to the electrical terminal at appropriate location. At step 908, test leads/jumpers of a test device associated with the selected test are attached to the conducting mechanisms of the electrical terminal test point. At step 910, measurements associated with the selected test are performed.

Conclusion:

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed:

1. An electrical terminal test point for an electrical terminal having a contact point, wherein the electrical terminal is positioned in electrical continuity with at least one lead through the contact point, the electrical terminal test point comprising:

a conducting mechanism configured for selective electrical connection to the contact point, wherein the electrical connection between the conducting mechanism and the contact point is selectively established and removed from the contact point without disrupting electrical continuity between the at least one lead and the electrical terminal through the contact point; and an attachment mechanism separate from the conducting mechanism and the electrical terminal, the attachment mechanism configured to secure the electrical terminal test point to the electrical terminal, wherein the attachment mechanism is non-conductive, wherein the attachment mechanism is configured to attach to the at least one lead associated with the contact point, wherein, when the attachment mechanism secures the electrical terminal test point to the electrical terminal, the attachment mechanism is configured to establish and maintain the electrical connection between the conducting mechanism and the contact point, and wherein the attachment mechanism comprises:

a first portion configured to extend substantially perpendicular to the at least one lead associated with the contact point when the electrical connection is established between the contact point and the conducting mechanism; and a second portion attached to and extending substantially perpendicular to the first portion of the attachment mechanism, wherein the attachment mechanism is configured to move substantially perpendicular to and rotate about the at least one lead, such that the second portion of the attachment mechanism is capable of attaching to the at least one lead.

2. The electrical terminal test point of claim 1, wherein the conducting mechanism further comprises:

a first portion configured to provide a connection point for one or more test leads of a test device; and a second portion attached to the first portion, said second portion configured to apply pressure to the contact point.

3. The electrical terminal test point of claim 2, wherein the first portion of the conducting mechanism is at least partially insulated and the second portion of the conducting mechanism is at least partially not insulated.

4. The electrical terminal test point of claim 2, wherein at least the second portion of the conducting mechanism is spring-loaded.

5. The electrical terminal test point of claim 1, wherein the electrical terminal test point comprises a plurality of conducting mechanisms, wherein a location associated with each respective conducting mechanism of the plurality of conducting mechanisms corresponds to a location associated with a specific one of a plurality of contact points.

6. The electrical terminal test point of claim 1, wherein the attachment mechanism comprises a spring-loaded L-hook.

7. The electrical terminal test point of claim 1, wherein the attachment mechanism comprises a Cleco fastener.

8. The electrical terminal test point of claim 1, wherein the attachment mechanism comprises a spring-loaded J-hook.

9. The electrical terminal test point of claim 1, wherein at least a portion of the attachment mechanism is insulated.

10. The electrical terminal test point of claim 1, wherein the attachment mechanism is directly connected to the conducting mechanism.

11. The electrical terminal test point of claim 1 further comprising:
a shield configured to protect the contact point, wherein the shield is configured to operatively connect the attachment mechanism and the conducting mechanism such that the conducting mechanism is positioned to make electrical contact with a contact point of the electrical terminal when the attachment mechanism secures the electrical terminal test point to the electrical terminal.

12. The electrical terminal test point of claim 11, wherein the conducting mechanism and the attachment mechanism are substantially perpendicular to and extend through the shield.

13. The electrical terminal test point of claim 11, wherein the shield is at least partially made of a non-metal material.

14. The electrical terminal test point of claim 11, wherein the shield is at least partially comprised of a see-through material.

15. The electrical terminal test point of claim 1, further comprising a handle.

16. The electrical terminal test point of claim 1, wherein the electrical terminal comprises a terminal block.

17. The electrical terminal test point of claim 1, wherein the contact point is configured to establish an electrical connection between two or more leads associated with the electrical terminal.

18. The electrical terminal test point of claim 17, wherein the electrical terminal comprises a terminal block.

19. A terminal block test point for a terminal block comprising one or more contact points, wherein respective contact points of the one or more contact points are configured to establish an electrical connection between two or more leads associated with the terminal block, the terminal block test point comprising:
a shield configured to protect the one or more contact points of the terminal block;
one or more conducting mechanisms substantially perpendicular to and extending through the shield, respective conducting mechanisms configured for selective electrical connection to one of the one or more contact points of the terminal block, wherein respective conducting mechanisms are capable of being removed from the corresponding contact point without disrupting the electrical connection established by the contact point between the two or more leads;
one or more attachment mechanisms substantially perpendicular to and extending through the shield, said attachment mechanisms being separate from the one or more conducting mechanisms, respective attachment mechanisms being configured to cause at least a portion of the shield to contact at least a portion of the terminal block, wherein the one or more attachment mechanisms are configured to establish an electrical connection between the one or more conducting mechanisms and the one or more contact points of the terminal block,
wherein, when an electrical connection is established between at least one of the one or more conducting mechanisms and a corresponding at least one contact point of the terminal block, a corresponding attachment mechanism of the one or more attachment mechanisms is configured to maintain the electrical connection between the at least one conducting mechanism and the corresponding at least one contact point of the terminal block, and
wherein each attachment mechanism comprises:
a first portion configured to extend substantially perpendicular to the two or more leads associated with the contact point when the electrical connection is established between the contact point and a corresponding conducting mechanism of the one or more conducting mechanisms; and
a second portion attached to and extending substantially perpendicular to the first portion of the attachment mechanism,
wherein the attachment mechanism is configured to move substantially perpendicular to and rotate about the two or more leads such that the second portion of the attachment mechanism is capable of attaching to the two or more leads.

20. The terminal block test point of claim 19, wherein the shield is configured to operatively connect the one or more attachment mechanisms and the one or more conducting mechanisms such that the conducting mechanisms are positioned to make electrical contact with a corresponding contact point of the electrical terminal.

21. A method for performing one of a plurality of tests in association with an electrical terminal, the electrical terminal having a plurality of contact points, respective contact points of the plurality of contact points being configured to establish an electrical connection between two or more leads associated with the electrical terminal, the method comprising:
attaching an electrical terminal test point to the electrical terminal, the electrical terminal test point comprising:
one or more conducting mechanisms, each configured for selective electrical connection to one of the plurality of contact points of the electrical terminal, wherein respective conducting mechanisms are capable of being attached and removed from the corresponding contact point without disrupting the electrical connection established by the contact point between the two or more leads; and
one or more attachment mechanisms separate from the one or more conducting mechanisms, said attachment mechanisms being configured to secure the electrical terminal test point to the electrical terminal, wherein each attachment mechanism of the one or more attachment mechanisms secures the electrical terminal test point to the electrical terminal, and wherein each attachment mechanism establishes and maintains the electrical connection between a corresponding conducting mechanism and a corresponding contact point,
wherein each attachment mechanism comprises:
a first portion configured to extend substantially perpendicular to the two or more leads associated with the contact point when the electrical connection is established between the contact point and a corresponding conducting mechanism of the one or more conducting mechanisms; and a second portion attached to and extending substantially perpendicular to the first portion of the attachment mechanism, wherein the attachment mechanism is configured to move substantially perpendicular to and rotate about the two or more leads, such that the second portion of the attachment mechanism is capable of attaching to the two or more leads;

selecting one of the plurality of tests to be performed in association with the electrical terminal;

identifying at least one of the plurality of contact points of the electrical terminal associated with the selected test; and selecting one of a plurality of electrical terminal test points based at least in part on the one or more identified contact points; and attaching one or more test leads of a test device to the one or more conducting mechanisms of the selected electrical terminal test point.

22. The method of claim 21, wherein a location associated with respective conducting mechanisms of the electrical terminal test point corresponds to a location associated with a specific one of the plurality of contact points of the electrical terminal, and wherein selecting one of the plurality of electrical terminal test points based at least in part on the one or more identified contact points comprises selecting the electrical terminal test point based at least in part on a location of the one or more identified contact points.

23. The method of claim 22, wherein the electrical terminal test point comprises a specific number of conducting mechanisms, and wherein selecting one of the plurality of electrical terminal test points based at least in part on the one or more identified contact points, further comprises selecting the electrical terminal test point based at least in part on a number of identified contact points.

24. The method of claim 21, wherein the electrical terminal test point further comprises a shield configured to protect the plurality of contact points of the electrical terminal, wherein the shield operatively connects the attachment mechanism and the conducting mechanism such that the conducting mechanism is positioned to make electrical contact with a corresponding contact point of the electrical terminal.

* * * * *